(12) United States Patent
Tran et al.

(10) Patent No.: US 10,886,287 B2
(45) Date of Patent: Jan. 5, 2021

(54) MULTIPLE-TIME PROGRAMMABLE (MTP) MEMORY DEVICE WITH A WRAP-AROUND CONTROL GATE

(71) Applicant: GLOBALFOUNDRIES Inc., Grand Cayman (KY)

(72) Inventors: Xuan Anh Tran, Clifton Park, NY (US); Sunil Kumar Singh, Mechanicville, NY (US); Shyue Seng Tan, Singapore (SG)

(73) Assignee: GLOBALFOUNDRIES INC., Grand Cayman (KY)

( * ) Notice: Subject to any disclaimer, the term of this patent is extended or adjusted under 35 U.S.C. 154(b) by 38 days.

(21) Appl. No.: 16/246,639

(22) Filed: Jan. 14, 2019

(65) Prior Publication Data

US 2020/0227424 A1    Jul. 16, 2020

(51) Int. Cl.
| | |
|---|---|
| H01L 27/11521 | (2017.01) |
| H01L 29/788 | (2006.01) |
| H01L 29/78 | (2006.01) |
| H01L 21/306 | (2006.01) |
| H01L 29/66 | (2006.01) |
| H01L 21/308 | (2006.01) |
| H01L 29/423 | (2006.01) |

(52) U.S. Cl.
CPC ...... *H01L 27/11521* (2013.01); *H01L 21/308* (2013.01); *H01L 21/30604* (2013.01); *H01L 29/42324* (2013.01); *H01L 29/66825* (2013.01); *H01L 29/785* (2013.01); *H01L 29/7881* (2013.01); *H01L 29/66545* (2013.01)

(58) Field of Classification Search
CPC ......... H01L 27/11521; H01L 29/42324; H01L 29/7881
See application file for complete search history.

(56) References Cited

U.S. PATENT DOCUMENTS

| | | | |
|---|---|---|---|
| 7,149,118 B2 * | 12/2006 | Diorio ................ | G11C 16/3404 365/185.18 |
| 8,772,854 B2 | 7/2014 | Fu et al. | |
| 9,362,374 B2 | 6/2016 | Tan et al. | |

(Continued)

OTHER PUBLICATIONS

Wang et al., "P-channel differential multiple-time programmable memory cells by laterally coupled floating metal gate fin field-effect transistors," Japanese Journal of Applied Physics, 57, 04FE14, 2018.

*Primary Examiner* — Cuong Q Nguyen
*Assistant Examiner* — Shih Tsun A Chou
(74) *Attorney, Agent, or Firm* — Yee Tze Lim; Hoffman Warnick LLC

(57) ABSTRACT

One illustrative MPT device disclosed herein includes an active region and an inactive region, isolation material positioned between the active region and the inactive region, the isolation material electrically isolating the active region from the inactive region, and an FG MTP cell formed in the active region. In this example, the FG MTP cell includes a floating gate, wherein first, second and third portions of the floating gate are positioned above the active region, the inactive region and the isolation material, respectively, and a control gate positioned above at least a portion of the inactive region, wherein the control gate is positioned above an upper surface and adjacent opposing sidewall surfaces of at least a part of the second portion of the floating gate.

16 Claims, 17 Drawing Sheets

(56) References Cited

U.S. PATENT DOCUMENTS

| | | |
|---|---|---|
| 9,406,689 B2 | 8/2016 | Li et al. |
| 9,406,764 B2 | 8/2016 | Shum et al. |
| 9,515,152 B2 | 12/2016 | Guo et al. |
| 9,543,016 B1 | 1/2017 | Jin |
| 2002/0093073 A1* | 7/2002 | Mori .................... H01L 27/105 257/510 |
| 2009/0014766 A1* | 1/2009 | Kim ..................... H01L 27/112 257/298 |

* cited by examiner

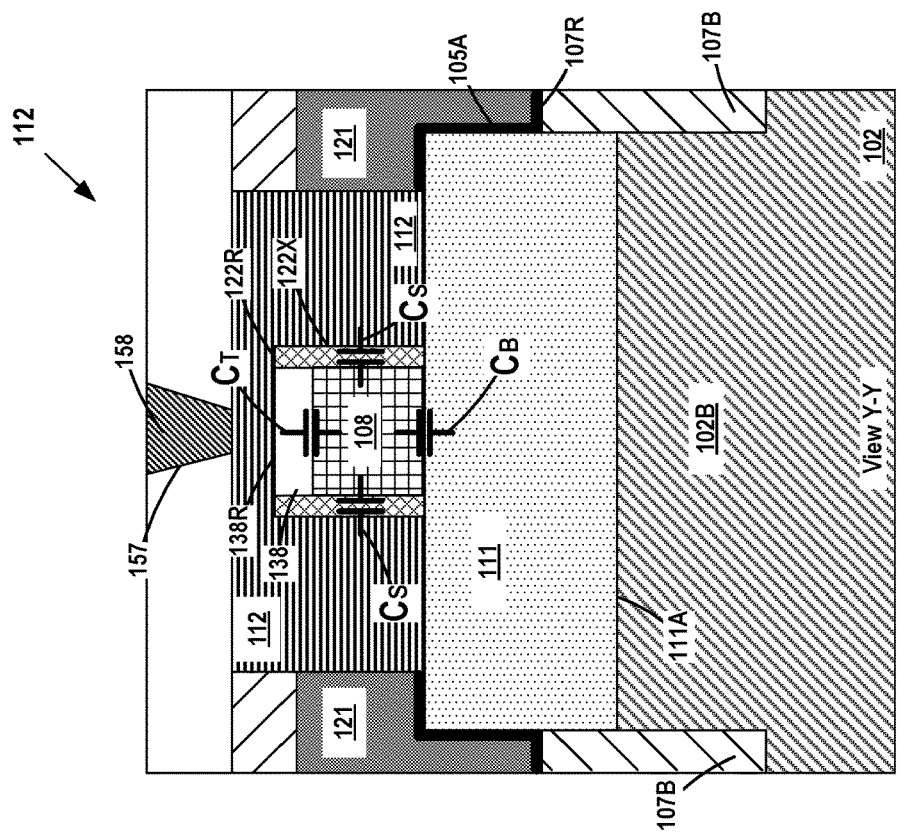
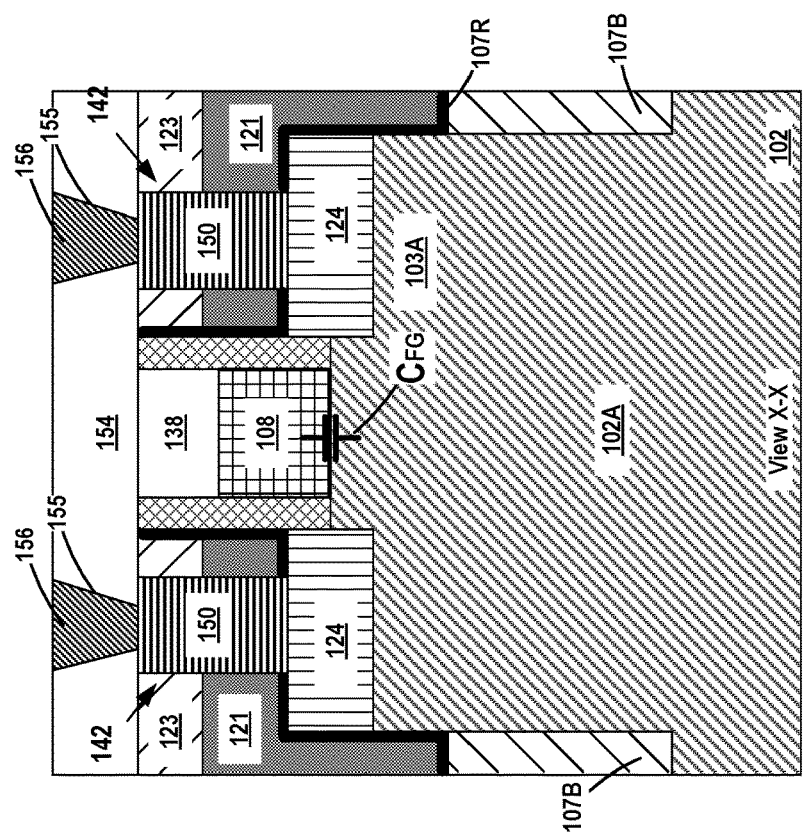
Fig. 25
Fig. 24

US 10,886,287 B2

MULTIPLE-TIME PROGRAMMABLE (MTP) MEMORY DEVICE WITH A WRAP-AROUND CONTROL GATE

BACKGROUND

1. Field of the Disclosure

The present disclosure generally relates to the fabrication of integrated circuits, and, more particularly, to various embodiments of a novel MTP (Multiple-Time Programmable) memory device with a wrap-around control gate and various novel methods of making such an MTP device.

2. Description of the Related Art

MTP memories have been recently introduced for beneficial use in a number of applications where customization is required for both digital and analog designs. The applications where such MTP memory products may be employed include data encryption, reference trimming, manufacturing identification (ID), security ID, and many other applications. MTP memories are a form of non-volatile memory (NVM) that retains the content therein even when power is removed. As it relates to power and size considerations, such MTP memories may be used to allow customization of circuit operation. Incorporating MTP memories nonetheless also typically comes at the expense of some additional processing steps. Some of the existing approaches to constructing MTP memories tend to suffer from slow access time, smaller coupling ratio and/or large cell size.

The present disclosure is directed to various embodiments of a novel MTP memory device with a wrap-around control gate and various novel methods of making such an MTP device that may solve or at least reduce one or more of the problems described above.

SUMMARY

The following presents a simplified summary of the disclosed embodiment in order to provide a basic understanding of some aspects of the subject matter disclosed herein. This summary is not an exhaustive overview of all of the subject matter disclosed herein. It is not intended to identify key or critical elements of the subject matter disclosed herein or to delineate the scope of any claims directed to any of the subject matter disclosed herein. Its sole purpose is to present some concepts in a simplified form as a prelude to the more detailed description that is discussed later in the application.

Generally, the present disclosure is directed to various embodiments of a novel MTP memory device with a wrap-around control gate and various novel methods of making such an MTP device. One illustrative MPT device disclosed herein includes a semiconductor substrate comprising an active region and an inactive region, isolation material positioned between the active region and the inactive region, wherein the isolation material electrically isolates the active region from the inactive region, and a floating gate MTP cell (FG MTP cell) formed in the active region. In this example, the FG MTP cell comprises a floating gate, wherein a first portion of the floating gate is positioned above the active region, a second portion of the floating gate is positioned above the inactive region and a third portion of the floating gate is positioned above the isolation material positioned between the active region and the inactive region and a control gate positioned above at least a portion of the inactive region, wherein the control gate is positioned above an upper surface and adjacent opposing sidewall surfaces of at least a part of the second portion of the floating gate.

BRIEF DESCRIPTION OF THE DRAWINGS

The disclosure may be understood by reference to the following description taken in conjunction with the accompanying drawings, in which like reference numerals identify like elements, and in which:

FIGS. 1-25 depict various embodiments of a novel MTP memory device with a wrap-around control gate and various novel methods of making such an MTP device.

Figure 1:
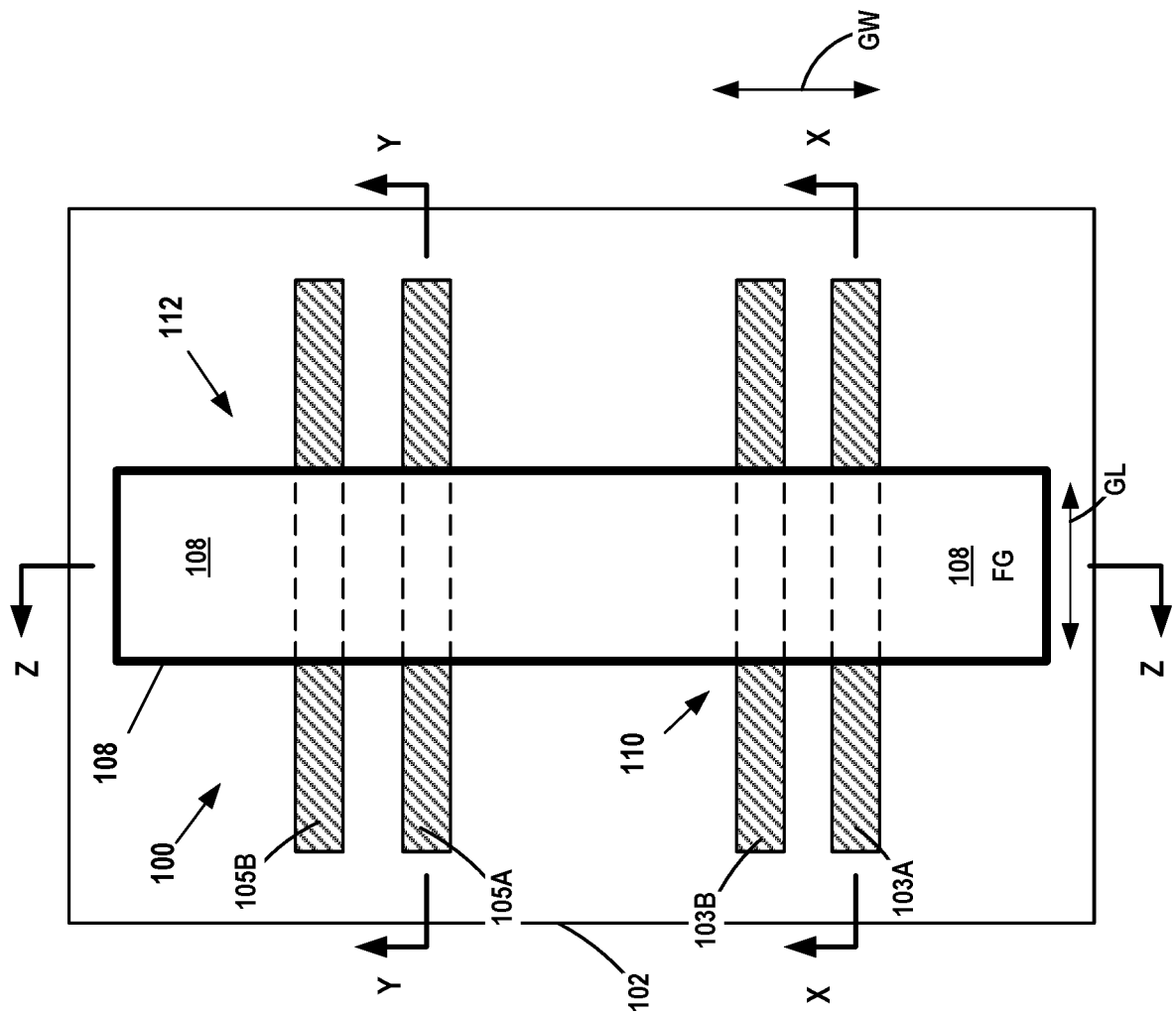

While the subject matter disclosed herein is susceptible to various modifications and alternative forms, specific embodiments thereof have been shown by way of example in the drawings and are herein described in detail. It should be understood, however, that the description herein of specific and illustrative embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

With reference to the attached figures, various illustrative embodiments of the methods and devices disclosed herein will now be described in more detail. The various layers of material described below may be formed by performing any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 1-25 depict various embodiments of a novel MTP memory device 100 with a wrap-around control gate and various novel methods of making such an MTP device 100. FIG. 1 is a simplistic plan view of one illustrative embodiment of some components of an MTP device 100 that may be formed using the methods described herein. FIG. 1 depicts a plurality of active fins 103A-B (collectively referenced using the numeral 103) and a plurality of inactive (or dummy) fins 105A-B (collectively referenced using the numeral 105) formed in a semiconductor substrate 102 (see, e.g., FIG. 2). An isolation material 107 (not shown in FIG. 1) is formed between and around the sets of fins 103 and 105 as well as between the individual fins 103, 105. Also depicted in FIG. 1 is a simplistically depicted floating gate (FG) 108 that will eventually be formed for the MTP device 100. As indicated, the floating gate 108 is positioned above the active fins 103 and the inactive fins 105. FIG. 1 also generally depicts the location where a floating gate MTP cell 110 (FG MTP cell) and an illustrative embodiment of a control gate 112 will be formed for the MTP device 100. The FG MTP cell 110 comprises a transistor. In the illustrative example depicted herein, the transistor of the FG MTP cell 110 is a FinFET device. The transistor of the FG MTP cell 110 is formed in and above the active fins 103 while the control gate 112 is formed above the inactive fins 105.

Various cross-sectional views of the product (views "X-X", "Y-Y and "Z-Z") depicted in the attached drawings are taken where indicated in FIG. 1. The cross-sectional views X-X and Y-Y are taken through the axial length of the fins 103A, 105A, respectively, in the gate length (GL— current transport) direction of the transistor of the FG MTP cell 110. The cross-sectional view Z-Z in the drawings is taken through the floating gate 108 in the gate width (GW) direction of the transistor of the FG MTP cell 110, i.e., transverse to the long axis of the fins 103, 105. The transistor of the FG MTP cell 110 also has a gate length (GL) direction that is approximately normal to the gate-width direction.

The substrate 102 (see FIG. 2) may have a variety of different configurations, such as the depicted bulk silicon configuration. The substrate 102 may also have a semiconductor-on-insulator (SOI) configuration that includes a base semiconductor layer, a buried insulation layer positioned on the base semiconductor layer, and an active semiconductor layer positioned on the buried insulation layer, wherein semiconductor devices are formed in and above the active layer. The substrate 102 may be made of silicon or it may be made of materials other than silicon. Thus, the terms "substrate" or "semiconductor substrate" should be understood to cover all semiconducting materials and all forms of such materials. Additionally, various doped regions, e.g., halo implant regions, well regions and the like, are not depicted in the attached drawings.

Figure 3:
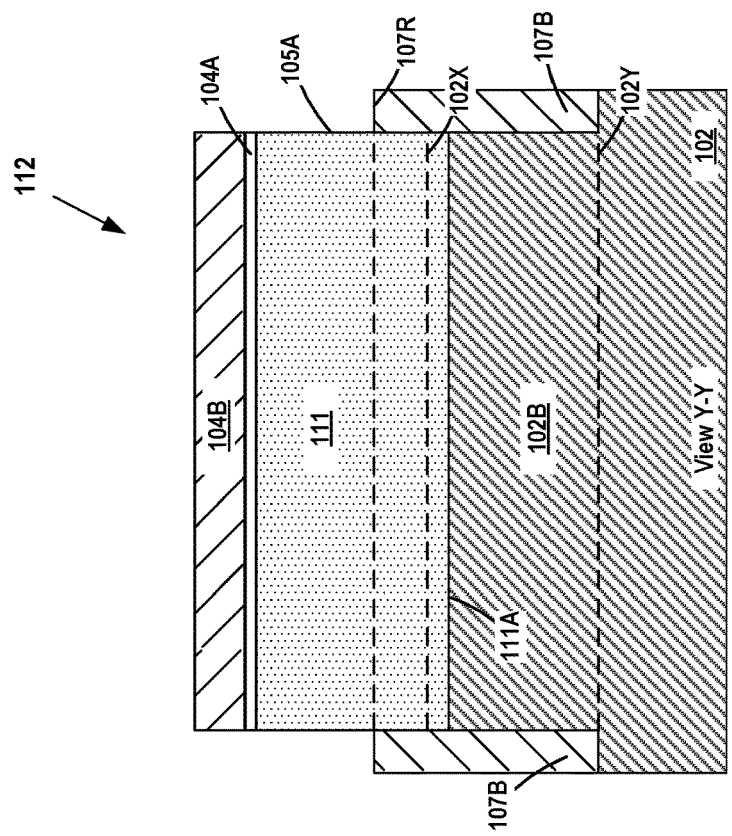
Figure 2:
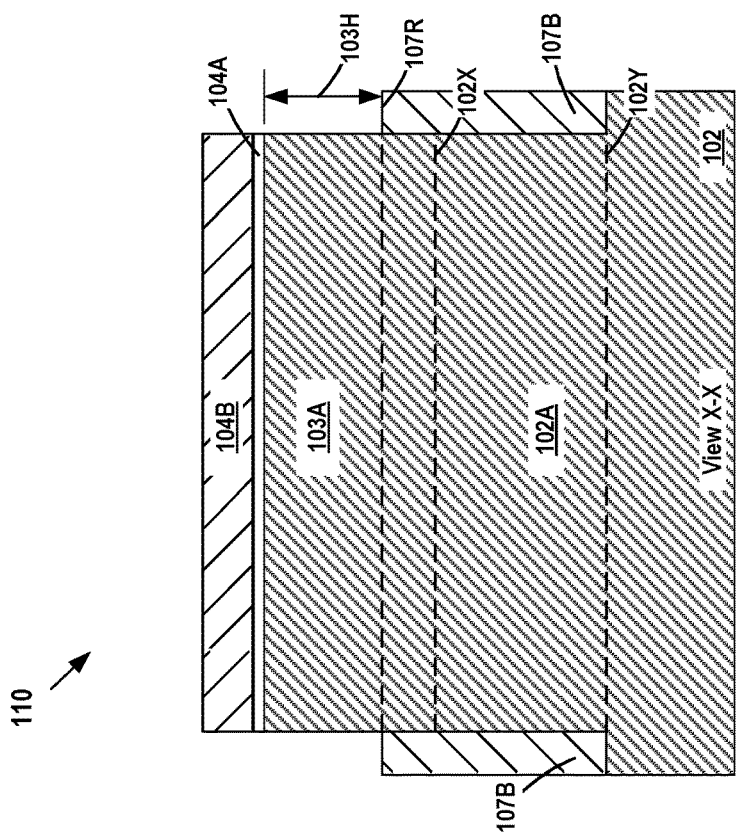
Figure 4:
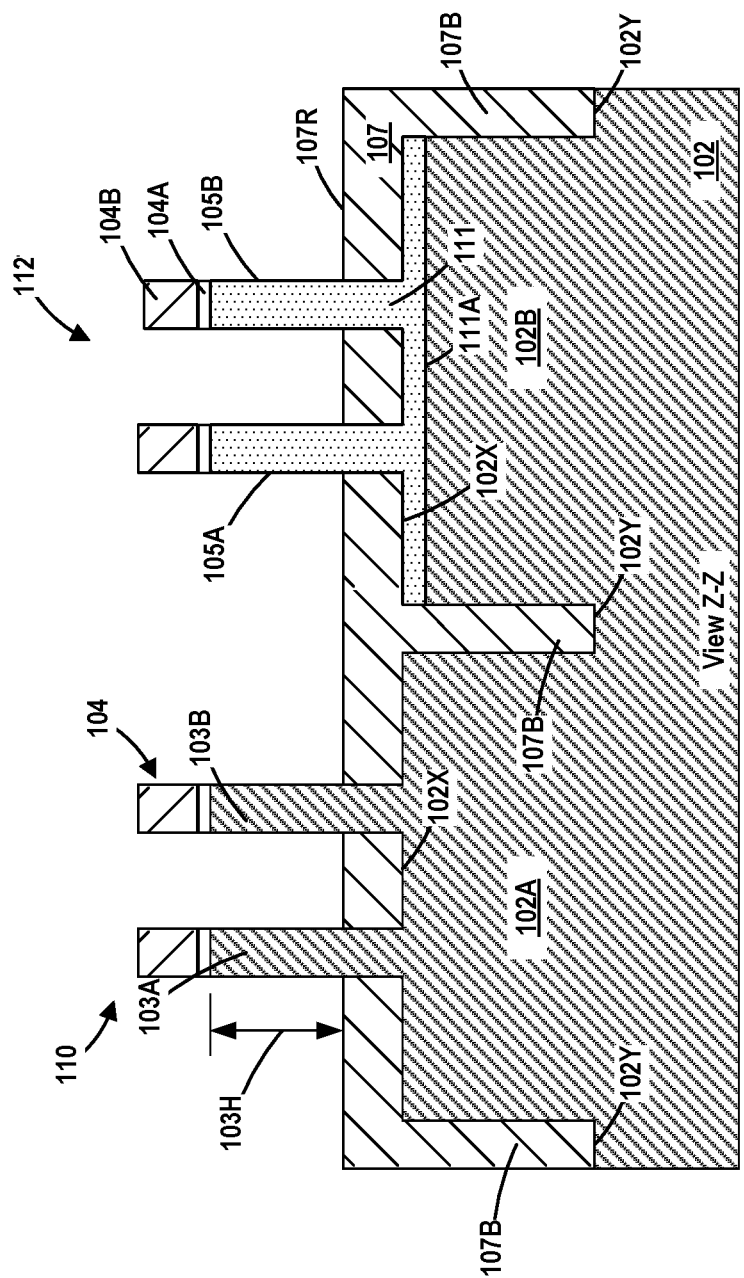

The exact process flow performed to produce various embodiments of the MTP device 100 disclosed herein may vary depending upon the particular application. FIGS. 2-4 depict the MTP device 100 at a relatively early stage of the fabrication process after several process operations were performed. In the illustrative example depicted herein, the transistor of the FG MTP cell 110 is a PFET transistor. However, as will be appreciated by those skilled in the art after a complete reading of the present application, the transistor of the FG MTP cell 110 could equally be an NFET transistor in other applications. A portion of the floating gate 108 serves as the conductive gate structure for the transistor.

In one illustrative example, the bulk substrate 102 is P-doped substrate. In one illustrative process flow, prior to the formation of the fins 103, 105, a simplistically depicted doped region 111 (see FIG. 3) was formed in the area of the substrate 102 where the inactive fins 105 will be formed by performing an ion implantation process through a patterned implant mask (not shown). Alternatively, the doped region 111 may be formed after formation of the fins 103, 105 by forming an appropriate patterned implantation mask and performing an ion implantation process. The doped region 111 may be doped with any type of dopant atoms (i.e., N-type or P-type atoms).

As will be appreciated by those skilled in the art after a complete reading of the present application, the doped region 111 is provided to reduce the resistance of the inactive fins 105 and to improve coupling between the inactive fins 105 and the floating gate 108. In one illustrative example, the doped region 111 may be doped with a dopant type that is opposite to the type (N or P) of the transistor of the FG MTP cell 110, e.g., when the transistor of the FG MTP cell 110 is an N-type transistor, the doped region 111 may be doped with a P-type dopant material, while the doped region 111 may be doped with an N-type dopant when the transistor of the FG MTP cell 110 is a P-type transistor. Thus, in the illustrative example depicted herein, the doped region 111 is an N+ doped well region 111. The depth of the doped region 111 and concentration of dopants in the doped region 111 may vary depending upon the particular application. In one illustrative example, the doped region 111 may have a dopant concentration of at least about $1 \times 10^{19}$-$1 \times 10^{21}$ ion/cm$^3$. In the depicted example, the as—implanted position of the bottom 111A of the doped region 111 is depicted as being positioned at a depth that is greater than the entire vertical height of the fins 103, 105, i.e., greater that the depth of the fin-formation trenches 102X that were formed in the substrate 102 to form the fins 103, 105, as described below. In other embodiments, the depth of the doped region 111 may be approximately equal to the entire vertical height of the fins 105. Additional doped regions (not shown) may also be formed in the substrate 102. At some point in time after the doped well region 111 was formed, the patterned implant mask was removed.

With continuing reference to FIGS. 2-4, in one illustrative process flow, the active fins 103 and inactive fins 105 were thereafter formed in the substrate 102 by performing traditional manufacturing techniques. For example, a patterned fin-formation etch mask 104 (comprised of, for example, a layer of silicon dioxide 104A and a layer of silicon nitride 104B) was formed above the substrate 102. Thereafter, one or more etching processes, e.g., anisotropic etching processes, were performed through the patterned fin-formation etch mask 104 to form a plurality of fin-formation trenches 102X in the substrate 102 and thereby define the plurality of fins 103, 105. At this point in the process flow, each of the fins 103, 105 may be an elongated line of material that extends across substantially the entire width of the substrate 102. The width and height of the fins 103, 105 may vary depending upon the particular application. Additionally, the overall size, shape and configuration of the fin-formation trenches 102X and fins 103, 105 may vary depending on the particular application.

Also depicted in FIGS. 2-4 is a recessed layer of insulating material 107 (e.g., silicon dioxide) with a recessed upper surface 107R and a plurality of deep isolation structures 107B formed in a plurality of deep trenches 102Y formed in the substrate 102. The formation of such isolation structures and materials as well as any desired cutting of the fins 103, 105 may be performed using traditional manufacturing techniques well known to those skilled in the art. The exposed height 103H of the fins 103, 105 above the recessed layer of insulating material 107 is shown in FIG. 2. As best seen in FIG. 4, the formation of the deep isolation structures 107B effectively defines separate islands 102A, 102B of semiconductor material 102 positioned below the fins 103, 105, respectively. Also note that, in the depicted example, the above-described doped region 111 extends throughout the entire vertical height of each of the inactive fins 105 and into the substrate region 102B. The region 102A may also be referred to as active region 102A, while the region 102B may also be referred to as inactive region 102B.

Of course, as will be understood by those skilled in the art after a complete reading of the present application the exact structure of the MTP device 100 shown in the drawings is provided by way of example only as a real-world MTP device 100 may have many variations as compared to the device shown in the attached drawings. For example, in the depicted embodiment, there are two active fins 103 and two inactive fins 105. However, the number of fins 103, 105 may vary depending on the particular application, e.g., the MTP device 100 may comprise any number of active fins 103 and any number of inactive fins 105. Moreover, the number of active fins 103 need not equal the number of inactive fins 105, although that may be the case in some applications. In one illustrative example, the MTP device 100 may comprise a single active fin 103 and three inactive fins 105. In another example, the MTP device 100 may comprise four active fins 103 and a single inactive fin 105. In even other applications, the formation of the inactive fins 105 may be omitted entirely. In this latter case, the substrate region 102B (with the doped region 111 formed therein) would effectively extend all the way to a level that is substantially equal to the level of the upper surface of the active fins 103. In general, as described more fully below, the inactive fin(s) 105 (or island) define a doped area—the doped region 111—in the substrate 102 above which will be positioned the conductive control gate 112 of the MTP device 100, wherein the control gate 112 wraps around the sides and the upper surface of the portion of the floating gate 108 positioned above the doped area 111 of the substrate 102, e.g., above the doped inactive fins 105 in the depicted example.

Figure 6:
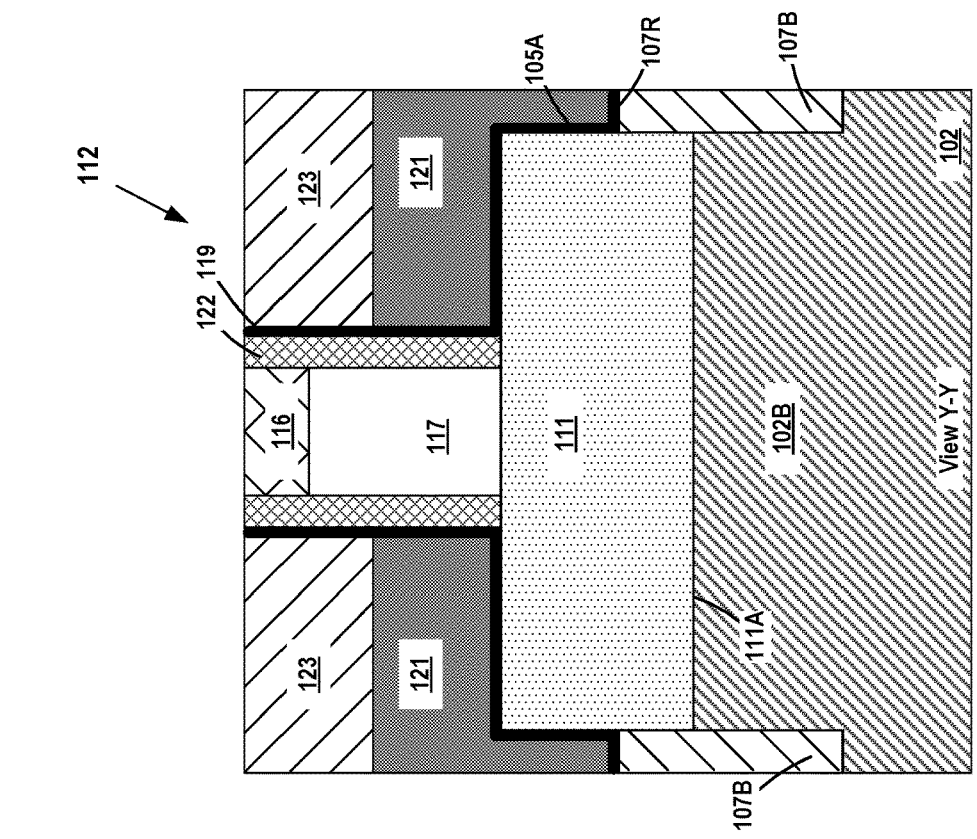
Figure 5:
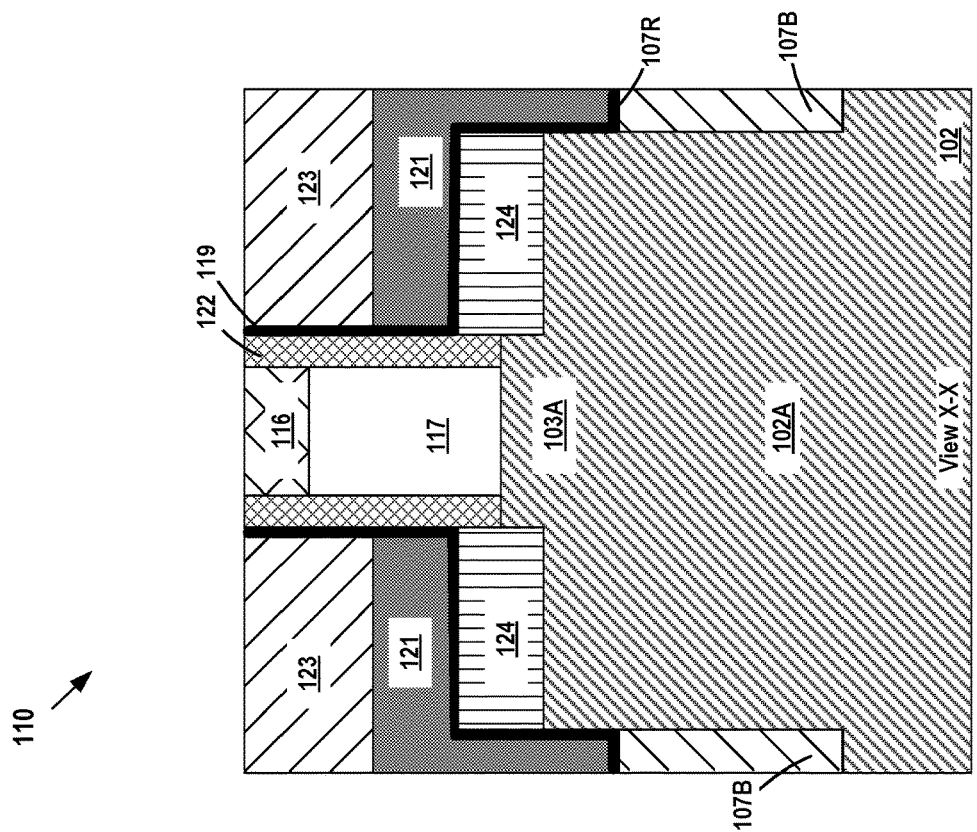
Figure 7:
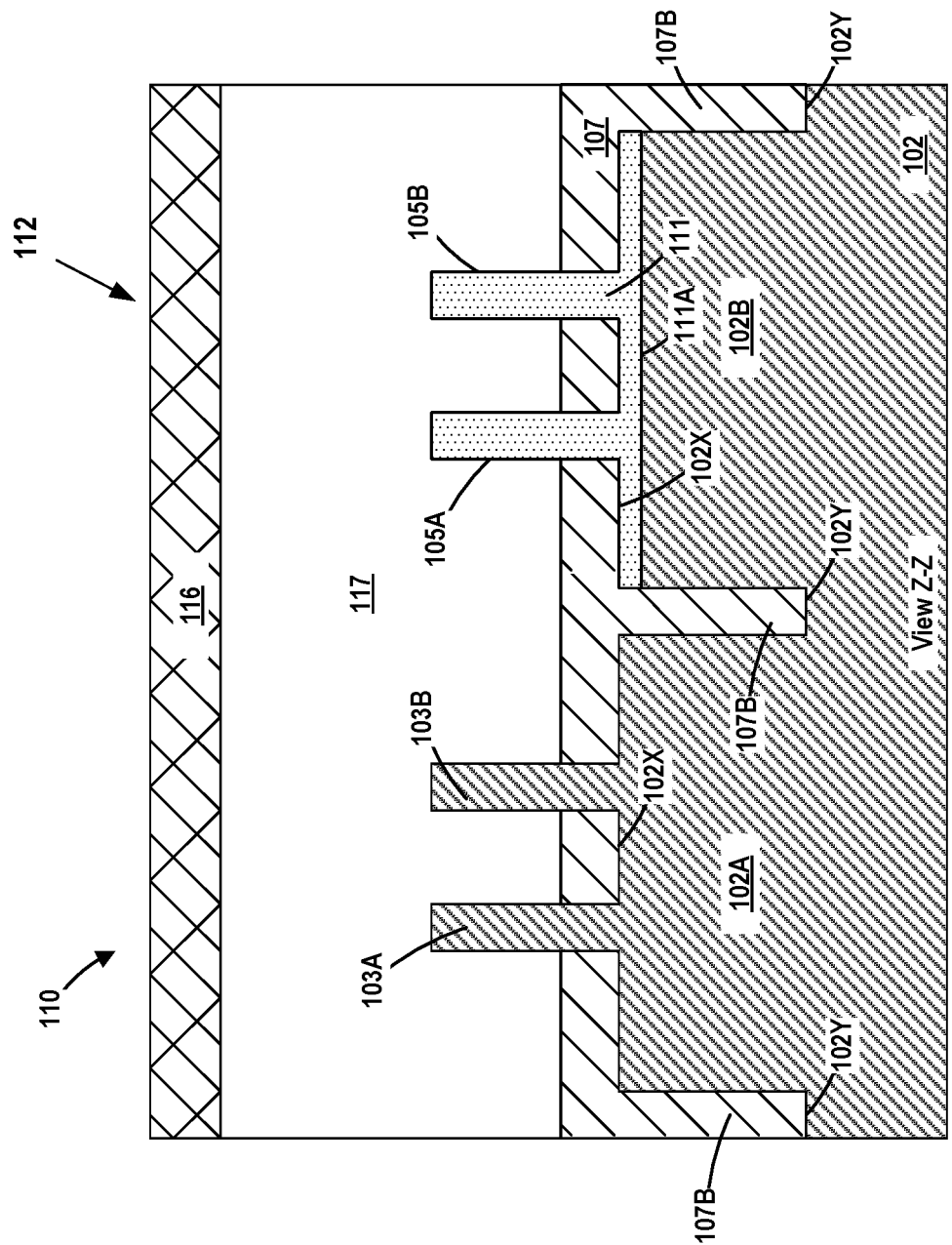

FIGS. 5-7 depict the MTP device 100 after several process operations were performed. In the depicted example, the floating gate structure 108 will be formed using known replacement-gate manufacturing techniques. Accordingly, a sacrificial (or "dummy") gate structure 117 with a sacrificial gate cap 116 (e.g., silicon nitride) formed thereabove was formed across the substrate 102. In one illustrative and non-limiting process flow, the sacrificial gate structure 117 comprises a sacrificial gate insulation layer (not separately shown—e.g., silicon dioxide) and a sacrificial gate electrode material (not separately shown—e.g., polysilicon or amorphous silicon). In one illustrative process flow, at a relatively early point in fabrication, the sacrificial gate structure 117 (with the gate cap 116 thereabove) may be a continuous line-type structure that extends across substantially the entire substrate 102, including across the fins 103, 105 and the isolation regions located between fins 103, 105. The long continuous line-type sacrificial gate structure 117/gate cap 116 structure may be formed by depositing the materials for the sacrificial gate structures 117 as well as a layer of material for the sacrificial gate caps 116 across the entire substrate 102, forming a patterned gate etch mask (not shown) above the deposited layer of the material for the sacrificial gate caps 116, and performing one or more etching processes through the patterned gate etch mask to remove the exposed portions of sacrificial gate cap material and, thereafter, the exposed portions of the sacrificial gate materials.

Next, still referencing FIGS. 5-7, a sidewall spacer structure 122 (e.g., silicon nitride, a low-k material (k value of 3.3 or less), etc.) was formed adjacent the sidewalls and end walls of the long continuous line-type sacrificial gate structure 117/sacrificial gate cap 116. The spacer 122 may be formed by depositing a conformal layer of spacer material and thereafter performing an anisotropic etching process. Various process operations are typically performed with the sacrificial gate structure 117, gate cap 116 and spacer 122 in position, e.g., source/drain implantation processes, the formation of epi semiconductor material 124 in the source/drain regions of the transistor of the FG MTP cell 110, etc. Next, a conformal contact etch stop layer 119 (e.g., silicon nitride) was formed on the MTP device 100 and above the epi semiconductor material 124. At that point, a layer of relatively flowable insulating material 121 (e.g., flowable silicon dioxide) was formed across the MTP device 100 so as to over-fill a portion of the open spaces adjacent the spacer 122 and above the epi material 124. In one example, the insulating material 121 may be formed by performing a spin-coating process. Thereafter, another layer of insulating material 123, e.g., an HPD oxide, was formed above the insulating material 121 by performing a CVD process. At that point, a CMP and/or etch-back process was performed to planarize the upper surface of the layer of insulating material 123 with the upper surface of the sacrificial gate cap 116. In one illustrative process flow, the materials of the sacrificial gate cap 116, the spacer 122 and the insulating material 123 may be comprised of materials that permit these structures and materials to be selectively etched relative to one another. In one illustrative example, the sacrificial gate cap 116 may be comprised of silicon nitride, the spacer 122 may be comprised of SiNC, etc., and the insulating material 123 may be comprised of silicon dioxide. In other cases, the sacrificial gate cap 116 and the spacer 122 may be made of the same material, e.g., silicon nitride, and the insulating material 123 may be silicon dioxide.

Figure 9:
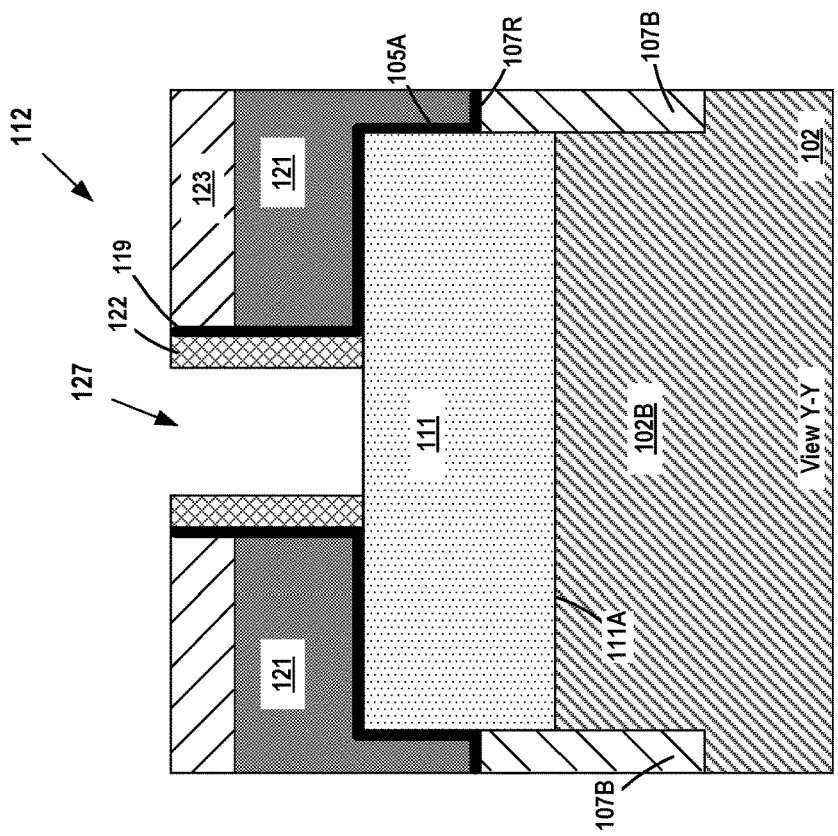
Figure 8:
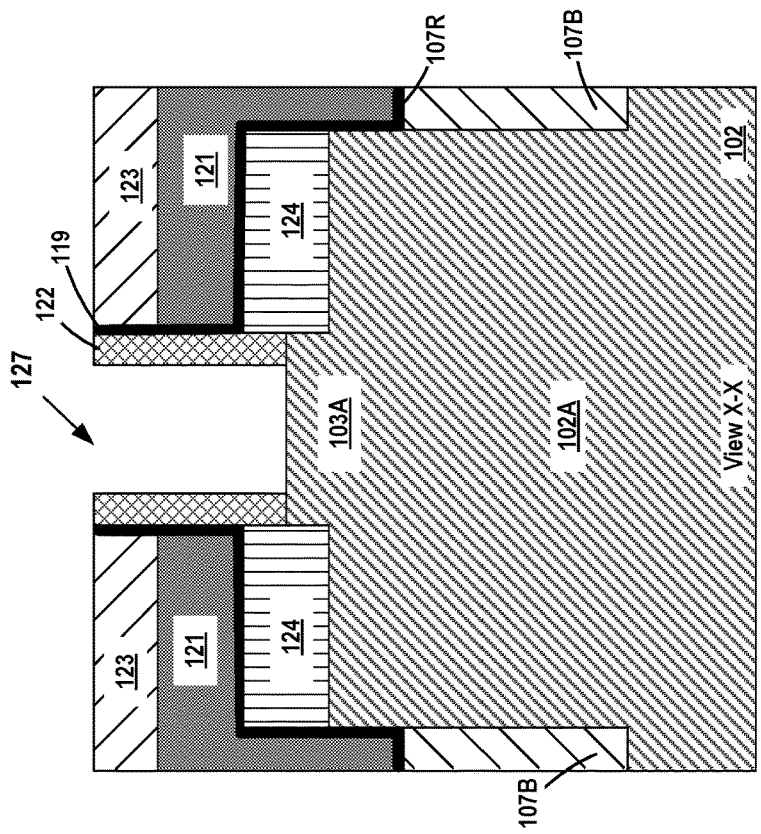
Figure 10:
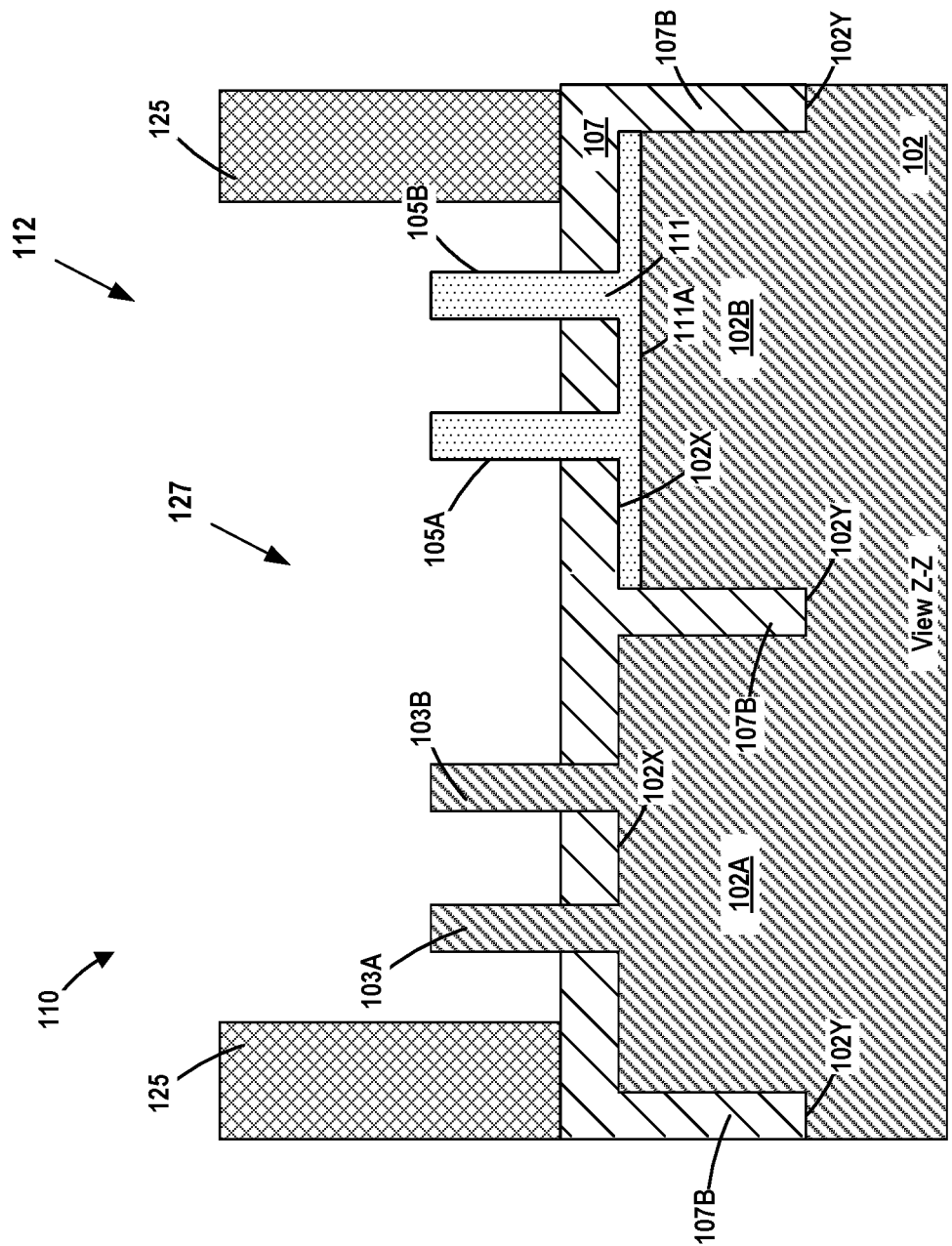

FIGS. 8-10 depict the MTP device 100 after several process operations were performed. First, with reference to FIG. 10, a patterned gate-cut etch mask (not shown) was formed above the MTP device 100. The gate-cut etch mask exposes portions of the long continuous line-type sacrificial gate structure 117/sacrificial gate cap 116 structure that are desired to be removed and replaced with insulating gate pillar structures 125 (or gate isolation structures) that effectively cut the long continuous line-type sacrificial gate structure 117/sacrificial gate cap 116 into a plurality of segments, each of which have a desired axial length (in the gate width direction of the transistor of the FG MTP cell 110). At that point the gate-cut etch mask is removed and the openings between the spacer 122 and the cut ends of the remaining sacrificial gate structure 117/sacrificial gate cap 116 segments is overfilled with insulating material so as to form the insulating gate pillar structures 125 adjacent the cut ends of the sacrificial gate structure 117/sacrificial gate cap 116 segment.

Still referencing FIGS. 8-10, after formation of the gate pillar structures 125, one or more CMP and/or etch-back processes was then performed to remove the sacrificial gate cap 116 and vertical portions of the insulating material 123, the etch-stop layer 119 and the spacer 122. This process operation exposes the sacrificial gate structure 117 for removal. Next, one or more etching processes was performed to selectively remove the materials of the sacrificial gate structure 117 relative to the surrounding materials. These operations result in the formation of a replacement gate cavity 127 that is laterally bounded—in the gate length direction—by the spacer 122 and—in the gate width direction—by the insulating pillars 125.

Figure 12:
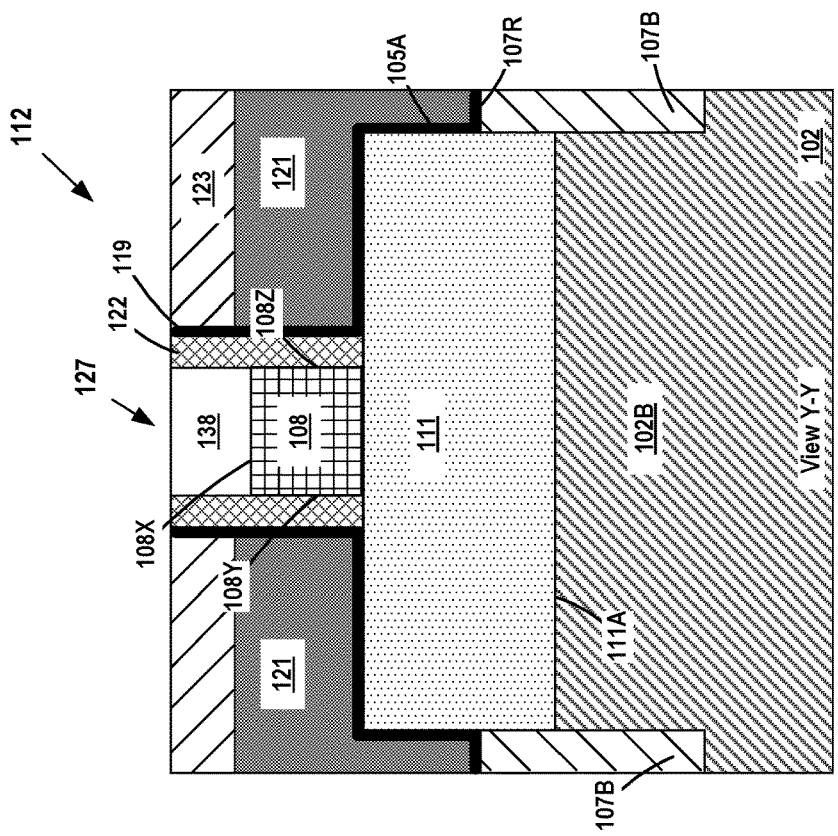
Figure 11:
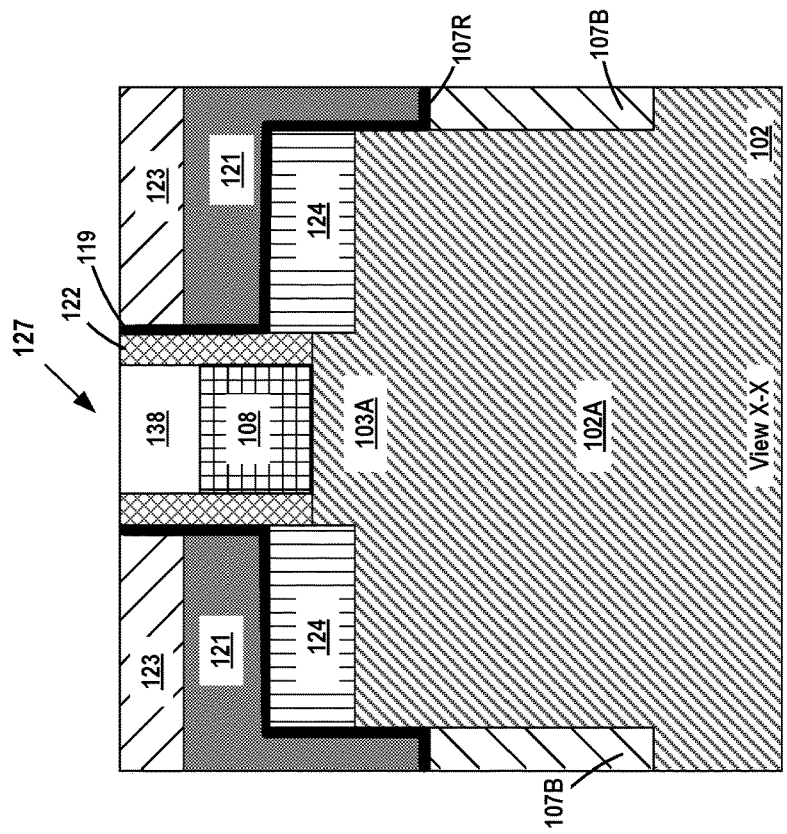
Figure 13:
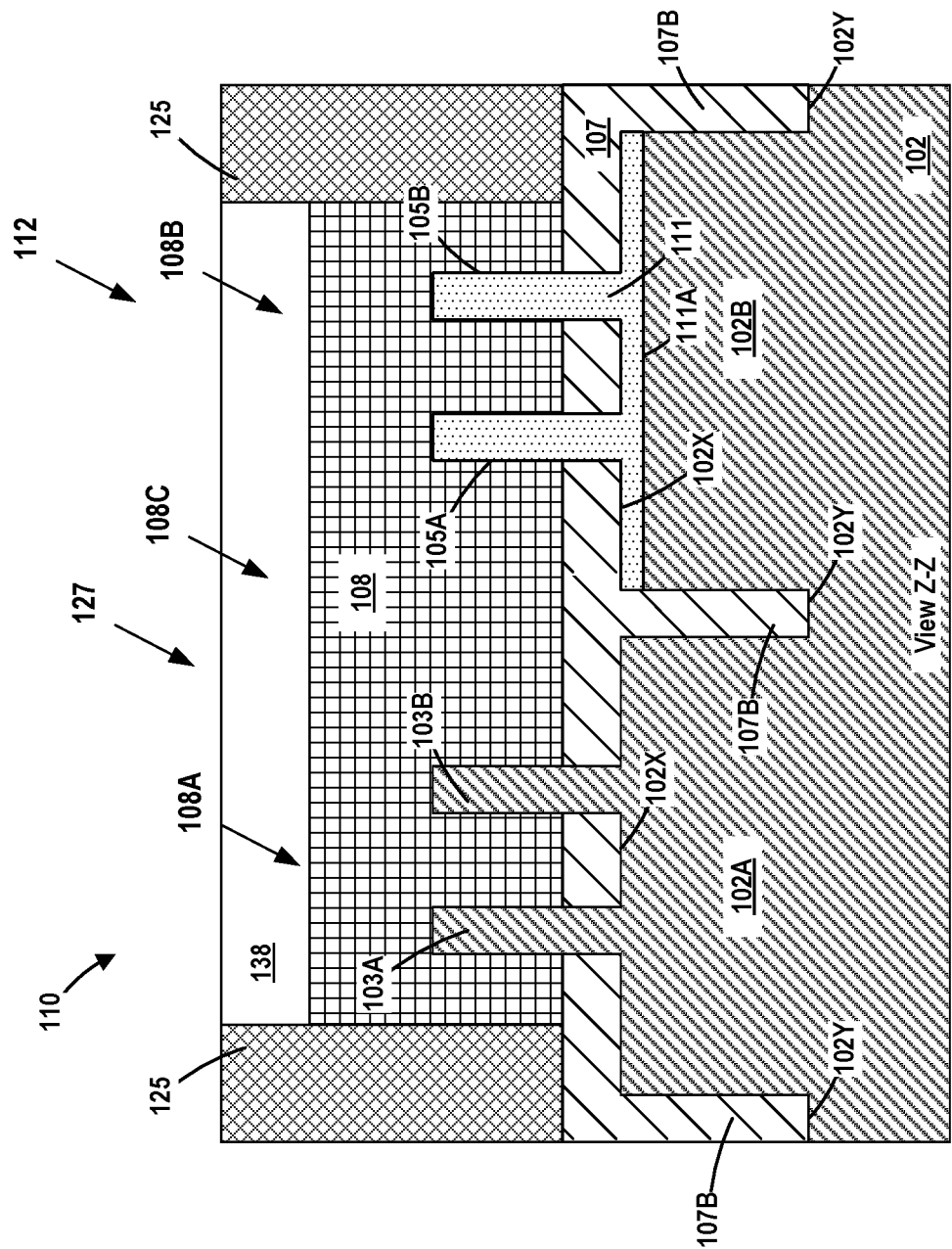
Figure 14:
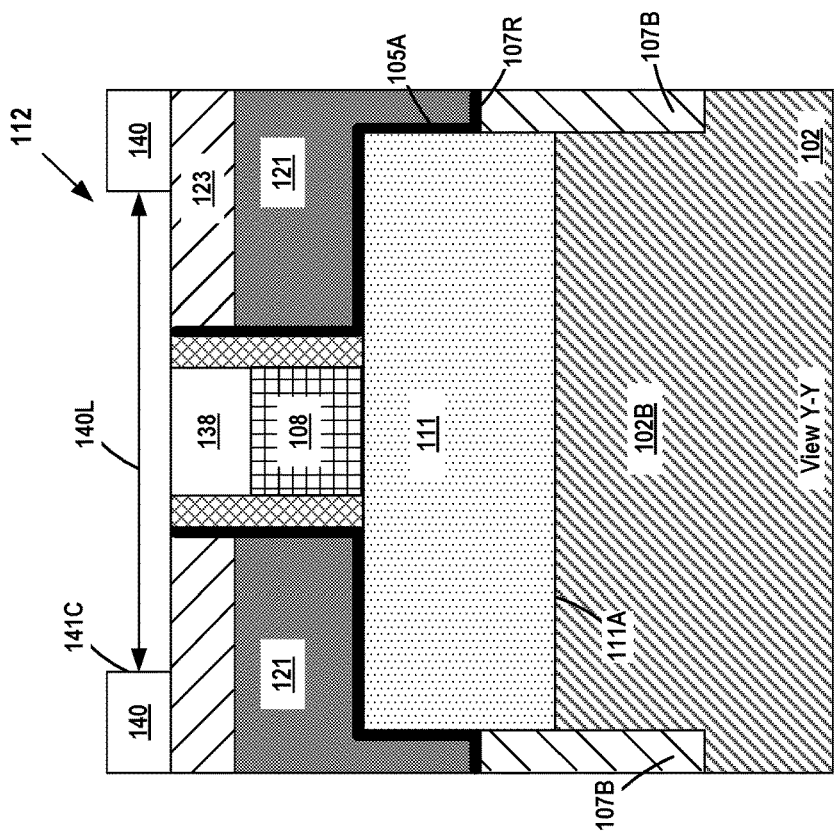
Figure 15:
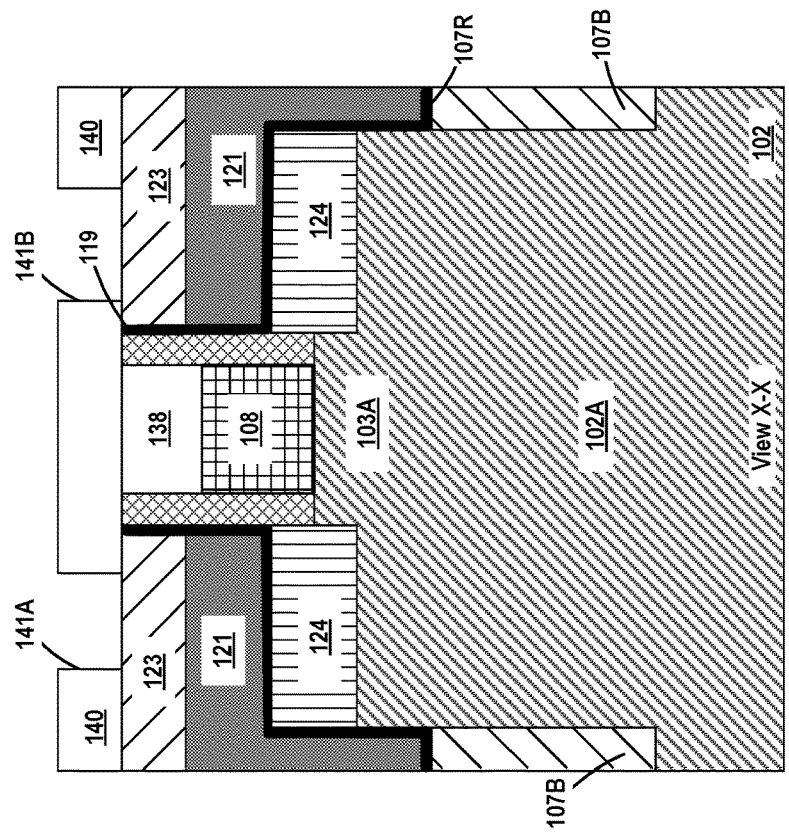

FIGS. 11-13 depict the MTP device 100 after several process operations were performed to form a representative and simplistically depicted floating gate structure 108 in the gate cavity 127 and to form a final gate cap layer 138 above the floating gate structure 108. In the illustrative example depicted herein, the floating gate structure 108 is manufactured using known replacement-gate manufacturing techniques. Using that manufacturing technique, the materials for the floating gate structure 108 are sequentially formed in the gate cavity 127. In one illustrative example, the floating gate structure 108 may be comprised of a high-k gate insulation layer (not separately shown), i.e., a material having a dielectric constant greater than 10, such as hafnium oxide, a bi-layer structure such as HfO2/SiO2, etc., and one or more conductive material layers that function as the conductive gate electrode (not separately shown) of the floating gate structure 108. After the materials for the floating gate structure 108 are deposited, one or more CMP process operations may be performed to remove the materials of the floating gate structure 108 that are positioned outside of the gate cavity 127. Next, one or more recess etching processes may be performed on the materials of the floating gate structure 108 to recess those materials so as to make room within the gate cavity 127 above the recessed floating gate structure 108 for the final gate cap 138. The amount of recessing of the materials of the floating gate structure 108 may vary depending upon the particular application, e.g., 30-60 nm. Thereafter, in this particular embodiment, the final gate cap 138 (e.g., SiN) was formed above the recessed floating gate structure 108 and within the gate cavity 127 by depositing gate cap material above the recessed floating gate structure 108 and performing a CMP process operation to planarize the upper surface of the final gate cap 138 with the upper surface of the layer of insulating material 123.

With reference to FIG. 13, in the example disclosed herein, a first portion 108A of the floating gate 108 is positioned above the active region 102A, a second portion 108B of the floating gate 108 is positioned above the inactive region 102B and a third portion 108C of the floating gate 108 is positioned above the isolation material 107 positioned between the active region 102A and the inactive region 102B. With reference to FIG. 12, the floating gate 108 has an upper surface 108X and opposing lateral sidewall surfaces 108Y, 108Z.

Figure 16:
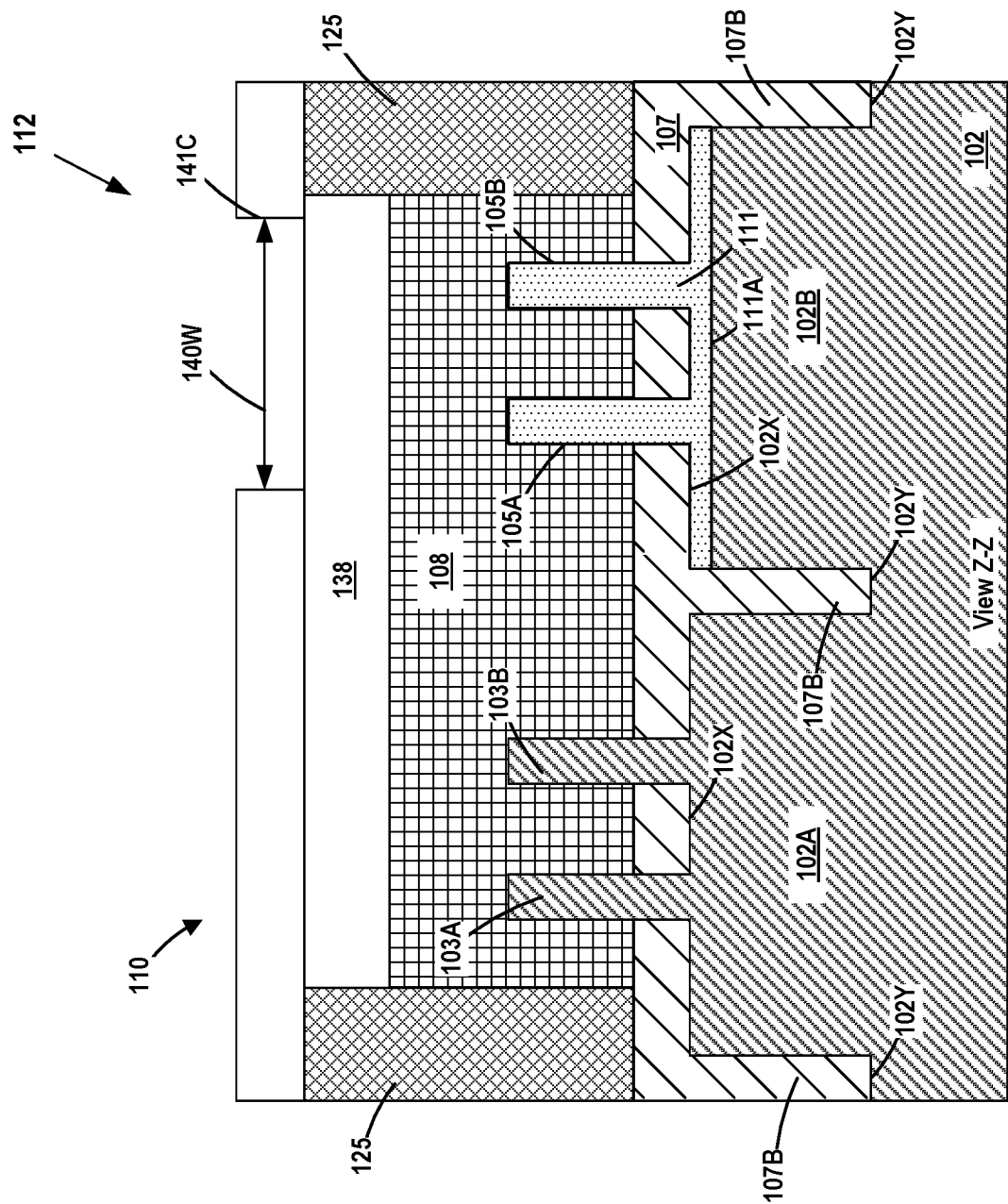
Figure 17:
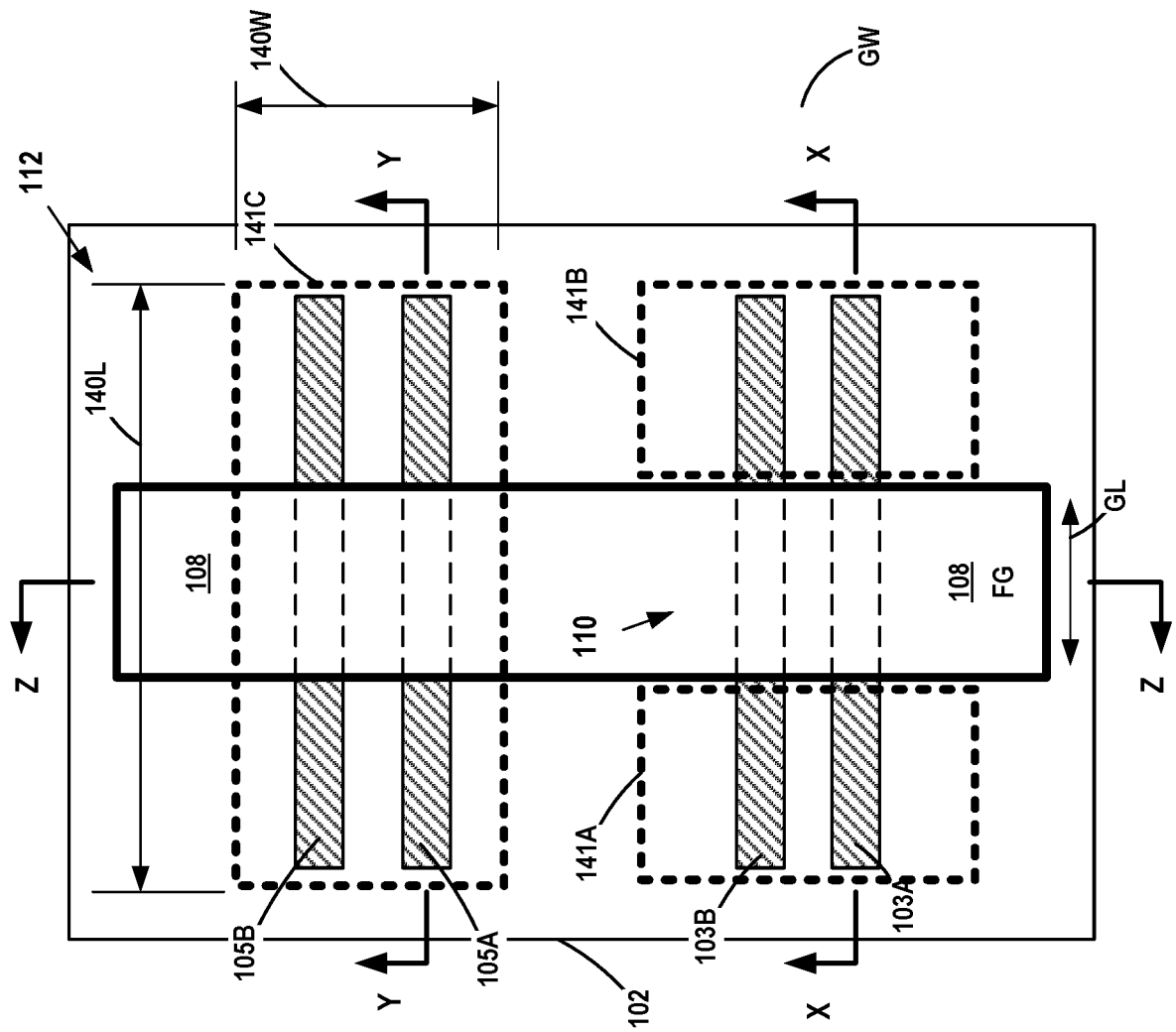

FIGS. 14-17 depict the MTP device 100 after a patterned etch mask 140, e.g., a patterned layer of photoresist or OPL, with openings 141A, 141B and 141C (collectively referenced using the numeral 141) formed therein was formed above the MTP device 100. In practice, there will be thousands of the openings 141 formed in the patterned etch mask 140. FIG. 17 is a copy of FIG. 1 that contains the locations (in dashed lines) where the openings 141 are positioned relative to various underlying structures. The openings 141A, 141B are each positioned at locations where it is desired to a form conductive source/drain structures 150 (see FIG. 21) (e.g., trench silicide structures) that are conductively coupled to the epi material 124 positioned in the source/drain regions of the transistor of the FG MTP cell 110. The opening 141C is positioned at a location where the above-mentioned conductive control gate 112 (e.g., trench silicide) of the MTP device 100 will be formed. The physical size and configuration of the openings 141 (when viewed from above) may vary depending upon the particular application. In the depicted example, the opening 141C has a length 140L (in the gate length direction) and a width 140W (in the gate width direction). As shown in FIG. 16, the opening 141C is positioned above the inactive fins 105 and the doped region 111 and is offset (in the gate width direction) from the transistor of the FG MTP cell 110.

Figure 19:
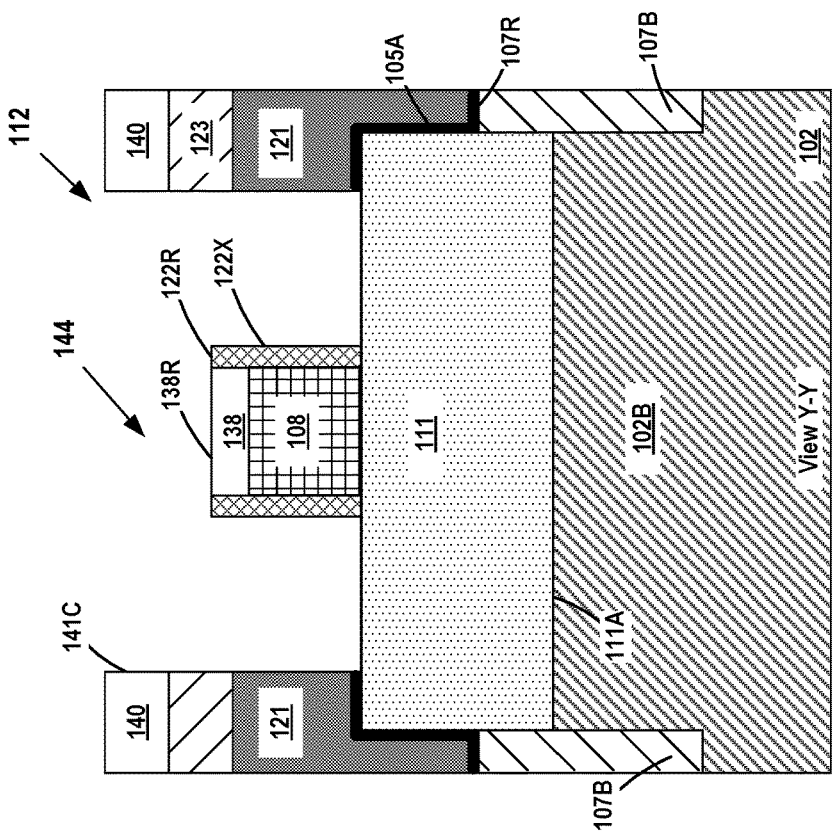
Figure 18:
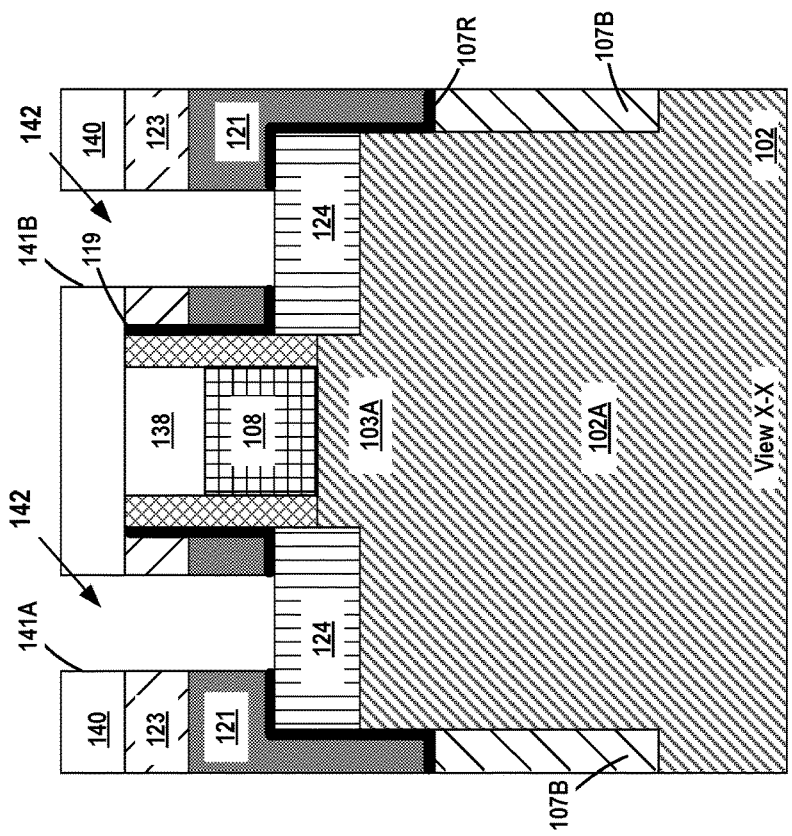
Figure 20:
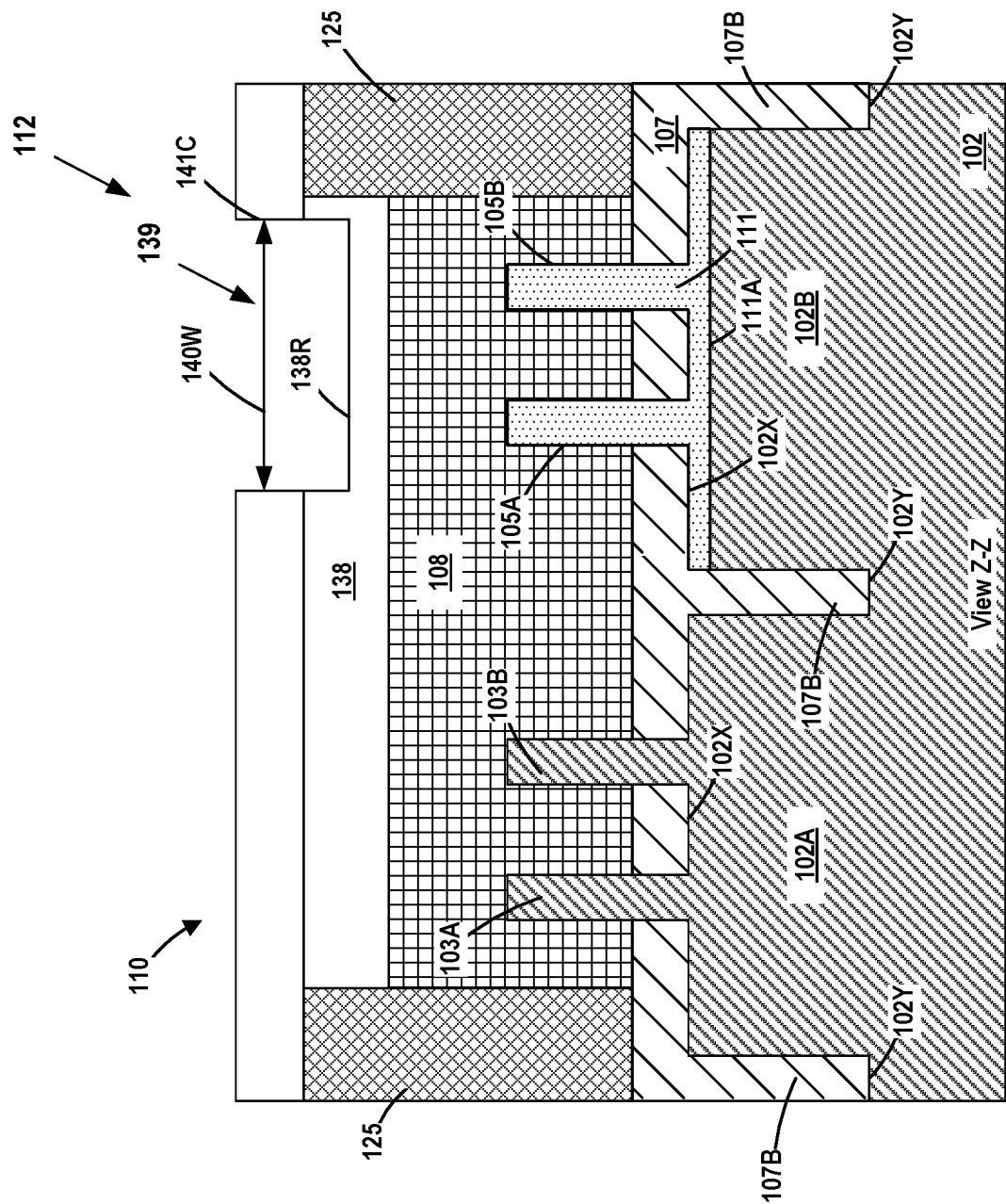

FIGS. 18-20 depict the MTP device 100 after one or more etching processes were performed through the patterned etch mask 140 to remove some or all of the materials exposed by the openings 141. These process operations result in the formation of a plurality of source/drain openings 142 and a control gate opening 144 where the conductive control gate 112 will be formed. In one illustrative embodiment, these etching processes are designed to primarily remove the insulating materials 123, 121 and the etch-stop layer 119. However, with reference to FIGS. 19 and 20, portions of the gate cap 138 and the spacer 122 exposed by the opening 141C are also exposed to these etching processes, but the materials of the gate cap 138 and the spacer 122 are more resistant to the etching processes performed to form the openings 142, 144. Accordingly, there is much less removal of the materials of the gate cap 138 and the spacer 122 as compared to the materials 123, 121 and 119. In the case where the etch-stop liner 119 is made of a material that is the same as that of, for example, the gate cap 138, the duration of the etching process to remove the etch-stop layer 119 may be sufficiently brief so as not to consume too much of the exposed portion of the gate cap 138. The net result is that, at the conclusion of these etching processes and the formation of the openings 142, 144, the exposed portion of the cap layer 138 has a recessed upper surface 138R and the exposed portion of the spacer 122 has a recessed upper surface 122R. Also note that the lateral width of the exposed portion of the spacer 122 may also be reduced during these etching processes as the lateral sidewall 122X of the spacer 122 is exposed to these etching processes as well. The amount of recessing of the gate cap 138 and the spacer 122 may vary depending upon the particular application, the various materials involved and perhaps the parameters of the etching processes. In one illustrative example, the exposed portion of the gate cap 138 with the recessed upper surface 138R may have a thickness that is about 40-60% of the original thickness of the gate cap 138, and the vertical height of the spacer 122 may be reduced by about 20-30 nm during these etching processes. The net result is the formation of a recessed notch 139 in the gate cap 138 at a location above the inactive region 102B, wherein the bottom surface 138R of the recessed notch 139 is positioned at a level below a level of the upper surface of the non-recessed portions of the gate cap 138.

Figure 22:
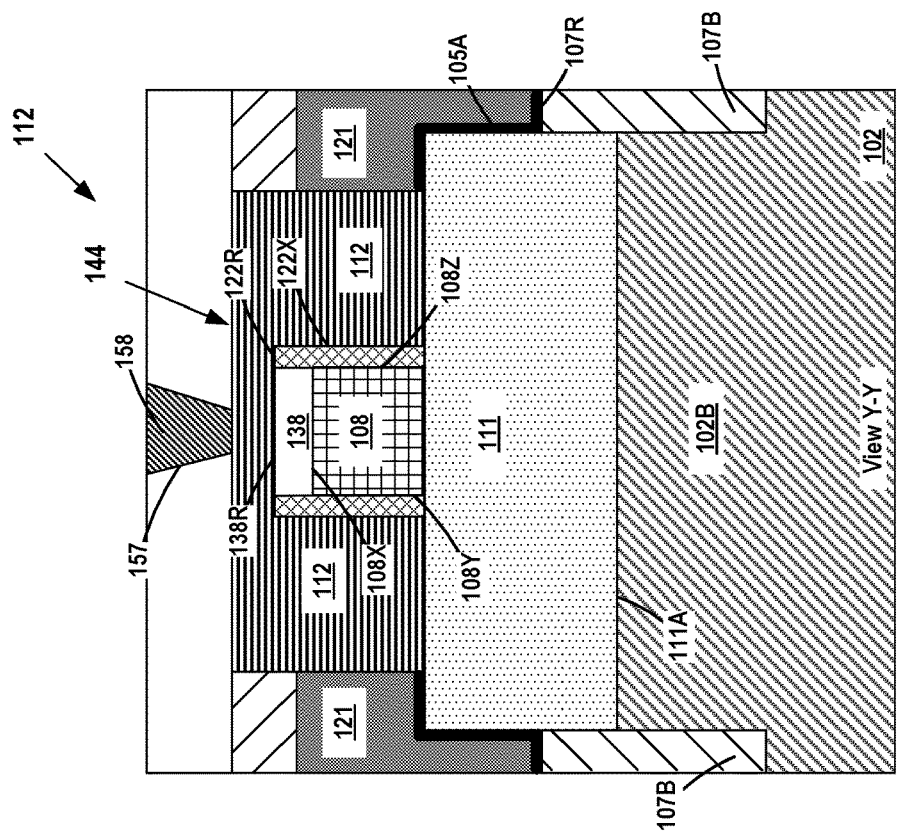
Figure 21:
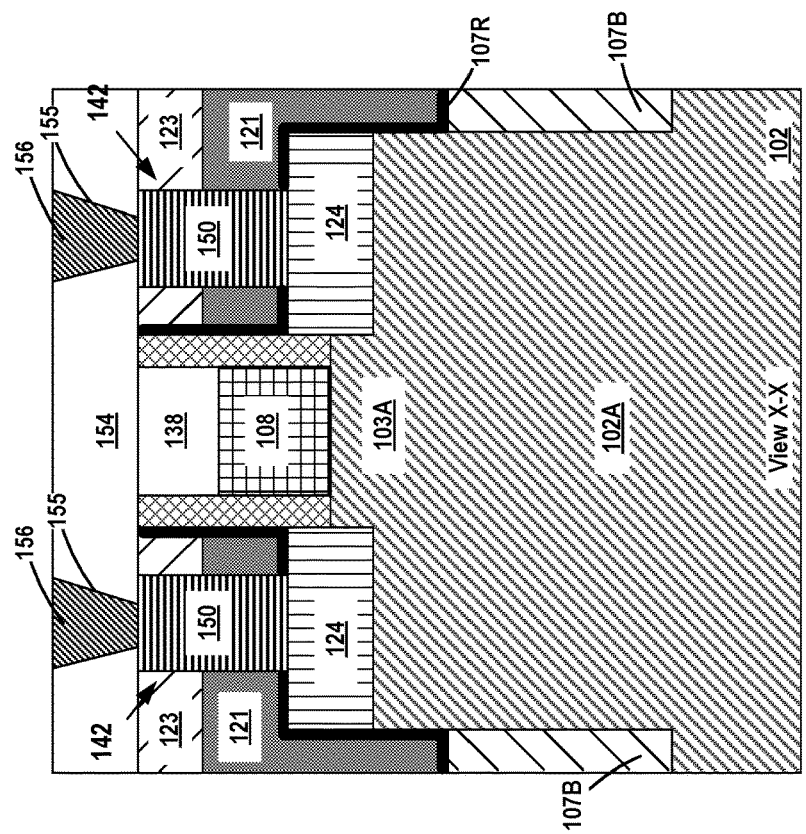
Figure 23:
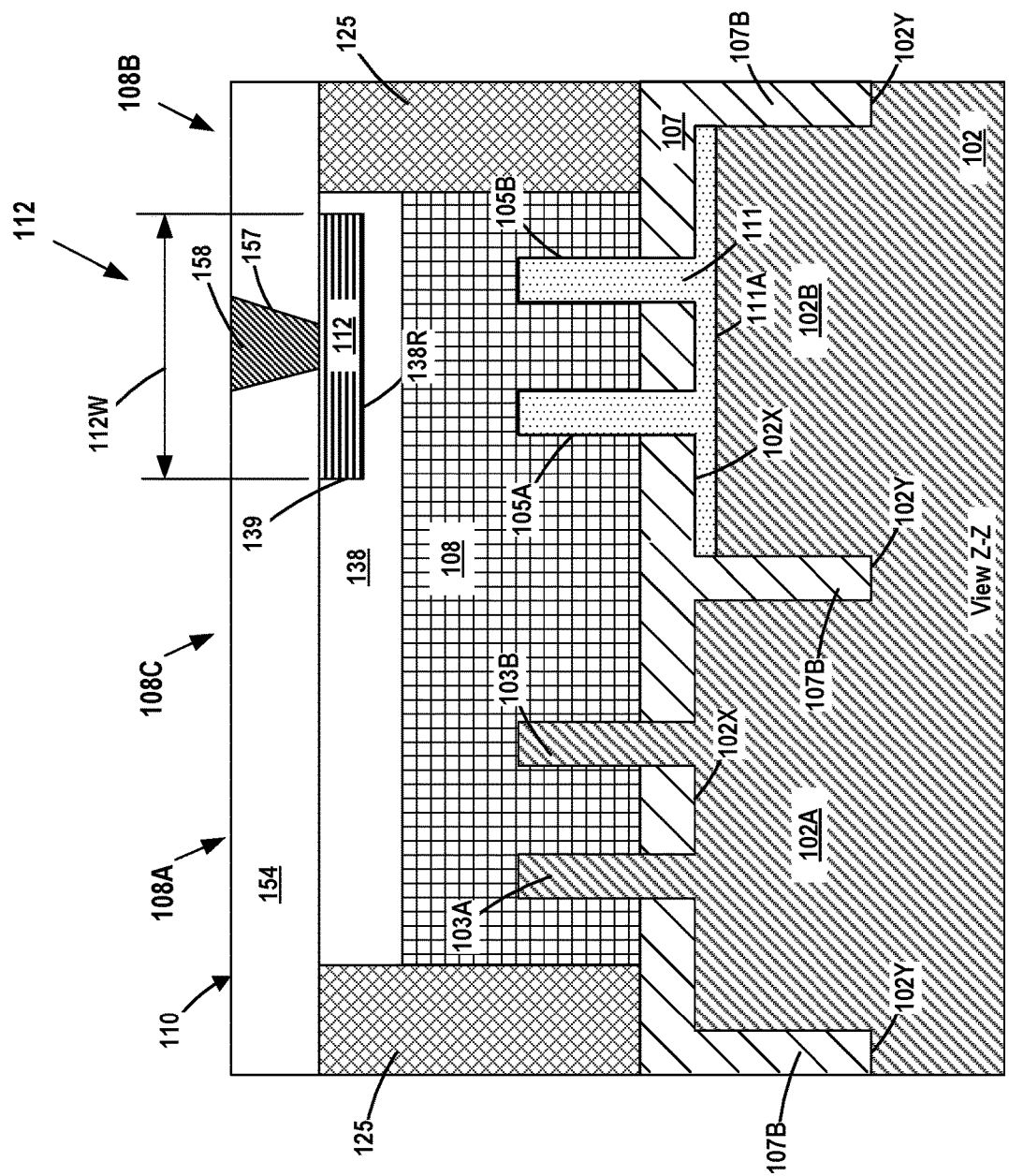

FIGS. 21-23 depict the MTP device 100 after several process operations were performed. First, the patterned etch mask 140 was removed. Then several process operations were performed to form source/drain metallization structures—the conductive source/drain structures 150 (see FIG. 21) in the openings 142—and to form the one-piece conductive control gate 112 in the opening 144. As depicted, the conductive source/drain structures 150 are conductively coupled to the epi material 124 in the source/drain regions of the transistor of the FG MTP cell 110. As also depicted, the control gate 112 is positioned vertically above at least a portion of the doped region 111 formed in the substrate 102 and wraps around the portion 108B of the floating gate 108 positioned above the doped region 111. More specifically, the control gate 112 is positioned above the upper surface 108X and adjacent the opposing sidewall surfaces 108Y, 108Z of at least a part of the axial length of the second portion 108B of the floating gate 108. Note that, as shown in FIG. 23, a portion of the control gate 112 is positioned within the recessed notch 139 formed in the recessed portion of the gate cap 138, wherein the bottom of the recessed notch is defined by the recessed upper surface 138R. In one illustrative example, the control gate 112 may have a dimension 112W (in the gate width direction) of about 1-1.5 μm, and the edge of the control gate 112 nearest the transistor may be laterally offset (in the gate width direction) from the transistor of the FG MTP cell 110 by any desired distance, e.g., 30-50 nm. The dimension 112W of the control gate 112 may be relatively long to improve coverage of the control gate 112 with respect to the underlying portion of the floating gate 108.

The dimension (in the gate width direction) of the doped region 111 may vary depending upon the particular application. Moreover, in one embodiment, the dimension (in the gate width direction) of the doped region 111 and the dimension 112W (in the gate width direction) of the control gate 112 may be sized independent of one another. In the gate length direction, the dimension of the control gate 112 may be substantially the same as a dimension of the doped region 111. In other examples, in the gate length direction, the dimension of the control gate 112 may be less than the dimension of the doped region. In the depicted example, when viewed in a cross-section taken in the gate length direction, the control gate 112 has an upside-down, generally U-shaped configuration with respect to how it wraps around at least part of the axial length of the second portion 108B of the floating gate 108.

In one illustrative embodiment, the conductive source/drain structures 150 and the conductive control gate 112 may be comprised of a variety of different conductive materials, e.g., tungsten, cobalt, aluminum, a metal, a metal compound, cobalt silicide, nickel silicide, titanium silicide, nickel platinum silicide, trench silicide structures, etc. In the depicted example, the conductive source/drain structures 150 for the transistor of the FG MTP cell 110 extend across substantially the entire active region of the FG MTP cell 110 in the gate width (GW) direction of the transistor of the FG MTP cell 110 (into and out of the plane of the drawing page in FIG. 21). In one illustrative process flow, the material(s) for the conductive source/drain structures 150 and the conductive control gate 112 were formed above the MTP device 100 so as to over-fill the openings 142, 144. At that point, one or more CMP and/or etch-back processes were performed to planarize the upper surface of the MTP device 100 and remove excess amounts of the material(s) for the conductive source/drain structures 150 and the conductive control gate 112 that were positioned outside of the openings 142, 144.

Still with reference to FIGS. 21-23, after the formation of the conductive source/drain structures 150 and the control gate 112, a layer of insulating material 154, e.g., silicon dioxide, was formed on the MTP device 100. At that point, a plurality of contact openings 155 (for a plurality of illustrative source/drain contacts 156) and a contact opening 157 (for a control gate contact 158) were formed in the layer of insulating material 154. Next, one or more conductive materials were formed in the openings 155, 157 and a CMP process was performed to remove excess amounts of the conductive material(s) positioned outside of the contact openings 155, 157 and above the upper surface of the layer of insulating material 154. These process operations result in the formation of the simplistically depicted source/drain contacts 156 and control gate contact 158. Of course, other contact structures (not shown) may also be formed on the MTP device 100 at the same time, e.g., a gate contact structure that is conductively coupled to the floating gate. At the point of processing depicted in FIGS. 21-23, various known processing operations may be performed to complete the fabrication of the MTP device 100.

As will be appreciated by those skilled in the art, the MTP device 100 disclosed herein may provide several unique advantages relative to prior art devices. FIGS. 24-25 are the same as FIGS. 21-22, respectively, except that some of the reference numbers have been omitted and other reference numbers and symbols have been added to explain some of the advantages of the subject matter disclosed herein. Due to the wrap-around configuration of the conductive control gate 112 (that wraps around the upper surface and the two sidewall surfaces of the floating gate 108) and the presence of the doped region 111 positioned in the substrate 102 under the conductive control gate 112, better capacitive coupling is provided between the control gate and the floating gate 108 during read or write operations that are performed on the MTP device 100. More specifically, with reference to FIG. 25, the unique configuration of one illustrative example of an MTP device 100 disclosed herein results in the formation of a top capacitor ($C_T$)—a capacitor formed between an upper portion of the conductive control gate 112 positioned in the recessed notch 139 in the gate cap 138 and the upper surface 108X of the floating gate 108; two side capacitors ($C_S$)—a capacitor formed between the conductive control gate 112 and the sides 108Y, 108Z of the floating gate 108; and a bottom capacitor ($C_B$)—a capacitor formed between a bottom of the floating gate 108 and the doped region 111. With reference to FIG. 24, a floating gate capacitor ($C_{FG}$) is formed between the floating gate 108 and the channel region of the transistor of the FG MTP cell 110. In one illustrative example, such an MTP device 100 has a coupling ratio ($C_R$) between the control gate 112 and the floating gate 108 on the order of about 0.7 or greater.

As will be appreciated by those skilled in the art after a complete reading of the presents application, one illustrative embodiment of an MPT device 100 disclosed herein includes an active region 102A and an inactive region 102B, isolation material 107 positioned between the active region 102A and the inactive region 102B, wherein the isolation material 107 electrically isolates the active region 102A from the inactive region 102B, and an FG MTP cell 110 formed in the active region 102A. In this example, the FG MTP cell 110 comprises a floating gate 108, wherein a first portion 108A of the floating gate 108 is positioned above the active region 102A, a second portion 108B of the floating gate 108 is positioned above the inactive region 102B, and a third portion 108C of the floating gate 108 is positioned above the isolation material 107 positioned between the active region 102A and the inactive region 102B, and a control gate 112 positioned above at least a portion of the inactive region 102B in the substrate, wherein the control gate 112 is positioned above an upper surface 108X and adjacent opposing sidewall surfaces 108Y, 108Z of at least a part of the second portion 108B of the floating gate 108. In effect, the control gate 112, in combination with the doped region 111, effectively wraps around the floating gate 108, thereby providing a better coupling ratio ($C_R$) between the control gate 112 and the floating gate 108 as compared to prior art MTP devices.

In some applications, with respect to various dimensions of certain structures in a direction corresponding to the gate width direction of the transistor of the FG MTP cell 110, the gate-width dimension 112W of the control gate 112 may be less than the gate width dimension of the doped well region 111 and the gate width dimension or the control gate 112 may be less than the gate-width dimension of the inactive region 102B. In still other embodiments, the entirety of control gate 112 may be positioned vertically above the inactive region 102B. In yet other embodiments, no portion of the control gate 112 is positioned vertically above the active region 102A.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed is:

1. An MTP (Multiple-Time Programmable) memory device, comprising:
   a semiconductor substrate comprising an active region and an inactive region;
   isolation material positioned between said active region and said inactive region, said isolation material electrically isolating said active region from said inactive region;
   a floating gate MTP cell (FG MTP cell) formed in said active region, said FG MTP cell comprising a floating gate, said floating gate comprising an upper surface and opposing lateral sidewall surfaces, wherein a first portion of said floating gate is positioned above said active region, a second portion of said floating gate is positioned above said inactive region and a third portion of said floating gate is positioned above said isolation material positioned between said active region and said inactive region;
   a control gate positioned above at least a portion of said inactive region, wherein said control gate is positioned above said upper surface and adjacent said opposing sidewall surfaces of at least a part of said second portion said floating gate;
   a gate cap positioned above said upper surface of said floating gate; and
   a recessed notch in said gate cap at a location above said inactive region, wherein a portion of said control gate is positioned in said recessed notch in said gate cap and wherein a first portion of said gate cap positioned above said first portion of said floating gate has an upper surface that is positioned at a first level and wherein said notched recess in said gate cap has a bottom surface that is positioned at a second level, said second level being lower than said first level.

2. The MTP memory device of claim 1, wherein said control gate is a one-piece structure.

3. The MTP memory device of claim 2, wherein said active region comprises at least one active fin and said inactive region comprises at least one inactive fin, wherein at least a portion of a doped well region is positioned within at least a portion of said at least one inactive fin.

4. The MTP memory device of claim 3, wherein said at least one inactive fin has a vertical fin height above a bottom of a fin-formation trench formed in said substrate in said inactive region and wherein said doped well region is located throughout an entire vertical fin height of said at least one inactive fin and extends into said substrate below said at least one inactive fin.

5. The MTP memory device of claim 1, further comprising a doped well region positioned in said inactive region, wherein said control gate is positioned vertically above at least a portion of said doped well region.

6. The MTP memory device of claim 5, wherein said FG MTP cell comprises a transistor of a first dopant type and wherein said doped well region is doped with a second dopant type that is opposite said first dopant type.

7. The MTP memory device of claim 6, wherein said transistor of said FG MTP cell is a PFET transistor, said doped well region is an N-doped well region and wherein said control gate comprises one of a metal silicide, a metal or a metal alloy.

8. The MTP memory device of claim 6, wherein said transistor of said FG MTP cell comprises a gate length extending in a gate length direction and a gate width extending in a gate width direction, wherein said doped well region has a first well dimension in said gate width direction, wherein said control gate has a first control gate dimension in said gate width direction and wherein said first control gate dimension is less than or equal to said first well dimension.

9. The MTP memory device of claim 1, wherein said FG MTP cell comprises a transistor, said transistor having a gate length extending in a gate length direction and a gate width extending in a gate width direction, wherein said inactive region has a dimension in said gate width direction, wherein said control gate has a first control gate dimension in said gate width direction and wherein said first control gate dimension is less than said dimension of said inactive region in said gate width direction.

10. The MTP memory device of claim 1, wherein an entirety of said control gate is positioned vertically above said inactive region.

11. The MTP memory device of claim 1, wherein said control gate is not positioned vertically above any of said active region.

12. An MTP (Multiple-Time Programmable) memory device, comprising:
    a semiconductor substrate comprising an active region and an inactive region, said active region comprising at least one active fin, said inactive region comprising at least one inactive fin;
    isolation material positioned between said active region and said inactive region, said isolation material electrically isolating said active region from said inactive region;
    an FG MTP cell in said active region, said FG MTP cell comprising a floating gate and a transistor of a first dopant type, said floating gate comprising an upper surface and opposing lateral sidewall surfaces, wherein a first portion of said floating gate is positioned above said active region, a second portion of said floating gate is positioned above inactive region and a third portion of said floating gate is positioned above said isolation material positioned between said active region and said inactive region;

a doped well region that is doped with a second dopant type that is opposite said first dopant type, wherein at least a portion of said doped well region is positioned within at least a portion of said at least one inactive fin;

a one-piece control gate positioned above at least a portion of said inactive region, wherein said control gate is positioned above said upper surface and adjacent said opposing sidewall surfaces of at least a part of said second portion of said floating gate and wherein said control gate is positioned vertically above at least a portion of said doped well region;

a gate cap positioned above said upper surface of said floating gate; and a recessed notch in said gate cap at a location above said inactive region, wherein a portion of said one-piece control gate is positioned in said recessed notch in said gate cap and wherein a first portion of said gate cap positioned above said first portion of said floating gate has an upper surface that is positioned at a first level and wherein said notched recess in said gate cap has a bottom surface that is positioned at a second level, said second level being lower than said first level.

13. The MTP memory device of claim 12, wherein said at least one inactive fin has a vertical fin height above a bottom of a fin-formation trench formed in said substrate in said inactive region and wherein said doped well region is located throughout an entire vertical fin height of said at least one inactive fin and extends into said substrate below said at least one inactive fin.

14. The MTP memory device of claim 12, wherein said transistor comprises a gate length extending in a gate length direction and a gate width extending in a gate width direction, wherein said doped well region has a first well dimension in said gate width direction and said control gate has a first control gate dimension in said gate width direction and wherein said first control gate dimension is less than or equal to said first well dimension.

15. The MTP memory device of claim 12, wherein said transistor comprises a gate length extending in a gate length direction and a gate width extending in a gate width direction, wherein said inactive region has a dimension in said gate width direction and said control gate has a first control gate dimension in said gate width direction, wherein said first control gate dimension is less than said dimension of said inactive region in said gate width direction and wherein an entirety of said one-piece control gate is positioned vertically above said inactive region.

16. The MTP memory device of claim 12, wherein said one-piece control gate is not positioned vertically above any of said active region.

* * * * *